US011030988B2

United States Patent
Yamabe et al.

(10) Patent No.: US 11,030,988 B2
(45) Date of Patent: Jun. 8, 2021

(54) SIGNAL PROCESSING DEVICE, SIGNAL PROCESSING METHOD, AND PROGRAM

(71) Applicant: Sony Corporation, Tokyo (JP)

(72) Inventors: Yushi Yamabe, Tokyo (JP); Kyosuke Matsumoto, Kanagawa (JP); Kohei Asada, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/335,712

(22) PCT Filed: Jun. 30, 2017

(86) PCT No.: PCT/JP2017/024135
§ 371 (c)(1),
(2) Date: Mar. 22, 2019

(87) PCT Pub. No.: WO2018/061371
PCT Pub. Date: Apr. 5, 2018

(65) Prior Publication Data
US 2020/0035212 A1    Jan. 30, 2020

(30) Foreign Application Priority Data
Sep. 30, 2016 (JP) .............................. JP2016-194644

(51) Int. Cl.
*G10K 11/178* (2006.01)
*H03G 3/30* (2006.01)
(Continued)

(52) U.S. Cl.
CPC .. *G10K 11/17823* (2018.01); *G10K 11/17853* (2018.01); *G10K 11/17873* (2018.01);
(Continued)

(58) Field of Classification Search
None
See application file for complete search history.

(56) References Cited

U.S. PATENT DOCUMENTS

| 9,986,326 B2* | 5/2018 | Murata | ................ H04R 1/1083 |
| 2008/0247560 A1* | 10/2008 | Fukuda | ................ G10K 11/178 |
| | | | 381/71.6 |

(Continued)

FOREIGN PATENT DOCUMENTS

| EP | 2136362 A1 | 12/2009 |
| EP | 2418642 A1 | 2/2012 |

(Continued)

OTHER PUBLICATIONS

International Search Report and English translation thereof dated Sep. 12, 2017 in connection with International Application No. PCT/JP2017/024135.

(Continued)

*Primary Examiner* — Qin Zhu
(74) *Attorney, Agent, or Firm* — Wolf, Greenfield & Sacks, P.C.

(57) ABSTRACT

[Object] To shorten a time until an effect is obtained after start of an adaptive process mode on an ambient sound.
[Solution] Provided is a signal processing device including: a noise cancellation processing unit configured to generate a noise cancellation signal on the basis of a collected ambient sound; a signal processing unit configured to generate an ambient sound adapted signal by performing dynamic analysis related to a feature of the ambient sound and filtering the ambient sound; and a control unit configured to control a plurality of modes related to signal processing. The plurality of modes includes a first mode in which acoustic reproduction based on the noise cancellation signal is performed and a second mode in which acoustic reproduction based on the noise cancellation signal and the ambient sound adapted signal is performed, and the signal processing unit continues the dynamic analysis even in the first mode.

19 Claims, 8 Drawing Sheets

(51) Int. Cl.
  *G10L 21/0208* (2013.01)
  *G10L 21/0224* (2013.01)
  *G10L 21/0232* (2013.01)

(52) U.S. Cl.
  CPC ... *H03G 3/3005* (2013.01); *G10K 2210/3028* (2013.01); *H03G 2201/103* (2013.01)

(56) References Cited

U.S. PATENT DOCUMENTS

| | | | | |
|---|---|---|---|---|
| 2009/0323976 | A1* | 12/2009 | Asada | G10K 11/178 381/71.1 |
| 2010/0266137 | A1* | 10/2010 | Sibbald | G10K 11/178 381/71.6 |
| 2014/0126734 | A1* | 5/2014 | Gauger, Jr. | H04R 3/002 381/71.6 |
| 2014/0172421 | A1* | 6/2014 | Liu | H04R 1/1083 704/227 |
| 2014/0314245 | A1 | 10/2014 | Asada et al. | |
| 2015/0078569 | A1 | 3/2015 | Magrath et al. | |
| 2015/0264469 | A1 | 9/2015 | Murata et al. | |
| 2015/0319522 | A1* | 11/2015 | Murata | G10K 11/178 381/71.6 |
| 2016/0086594 | A1 | 3/2016 | Asada et al. | |

FOREIGN PATENT DOCUMENTS

| | | |
|---|---|---|
| EP | 2 779 685 A1 | 9/2014 |
| JP | 2010-011117 A | 1/2010 |
| JP | 2013-102370 A | 5/2013 |
| JP | 2015-173369 A | 10/2015 |

OTHER PUBLICATIONS

Written Opinion and English translation thereof dated Sep. 12, 2017 in connection with International Application No. PCT/JP2017/024135.
International Preliminary Report on Patentability and English translation thereof dated Apr. 11, 2019 in connection with International Application No. PCT/JP2017/024135.
Extended European Search Report dated Jul. 24, 2019 in connection with European Application No. 17855330.1.

* cited by examiner

FIG. 4

| OPERATION MODE<br>CONFIGURATION | FIRST MODE | SECOND MODE |
|---|---|---|
| FIRST FILTER PROCESSING UNIT | C | A |
| FIRST DYNAMIC FILTER GENERATION UNIT | B | A |
| FIRST AMBIENT SOUND DYNAMIC ANALYSIS UNIT | A | A |
| SECOND FILTER PROCESSING UNIT | C | A |
| SECOND DYNAMIC FILTER GENERATION UNIT | B | A |
| SECOND AMBIENT SOUND DYNAMIC ANALYSIS UNIT | A | A |
| AMBIENT SOUND MONITOR OUTPUT SWITCH | D | A |

FIG. 7A

| OPERATION MODE / SETTING GAIN EXAMPLE | FIRST GAIN | SECOND GAIN |
|---|---|---|
| FIRST GAIN | +XdB | ±0dB |
| SECOND GAIN | -XdB | ±0dB |
| THIRD GAIN | +XdB | ±0dB |

FIG. 7B

| OPERATION MODE / SETTING GAIN EXAMPLE | FIRST GAIN | SECOND GAIN |
|---|---|---|
| FIRST GAIN | ±0dB | -XdB |
| SECOND GAIN | ±0dB | +XdB |
| THIRD GAIN | ±0dB | -XdB |

SIGNAL PROCESSING DEVICE, SIGNAL PROCESSING METHOD, AND PROGRAM

CROSS REFERENCE TO RELATED APPLICATIONS

This is a U.S. National Stage Application under 35 U.S.C. § 371, based on International Application No. PCT/JP2017/024135, filed Jun. 30, 2017, entitled "SIGNAL PROCESSING DEVICE, SIGNAL PROCESSING METHOD, AND PROGRAM", which claims priority under 35 U.S.C. § 119(a)-(d) or 35 U.S.C. § 365(b) to Japanese Patent Application Number 2016-194644, filed Sep. 30, 2016, each of which is hereby incorporated by reference in its entirety.

TECHNICAL FIELD

The present disclosure relates to a signal processing device, a signal processing method, and a program.

BACKGROUND ART

In recent years, devices that have functions not only of outputting acoustic information to acoustic devices such as earphones or headphones but also of assuming use situations have been used. As examples of such functions, a so-called noise cancellation function and a noise reduction function can be exemplified. In addition, for example, Patent Literature 1 discloses a technology for combining a listening target speech signal emphasized through a noise reduction process with a speech signal subjected to a noise cancellation process.

CITATION LIST

Patent Literature

Patent Literature 1: JP 2010-11117A

DISCLOSURE OF INVENTION

Technical Problem

Incidentally, in an adaptive process on an ambient sound, such as a noise reduction process, it is necessary to analyze an ambient sound for an adequate time. For example, in the case of the noise reduction process, an analysis time taken to determine a stationary sound (noise) or a nonstationary sound (listening target) is necessary. However, in the technology disclosed in Patent Literature 1, an operation of a noise reduction processing system starts in response to pressing of a sound monitor button. Therefore, in the technology disclosed in Patent Literature 1, even when the sound monitor button is pressed, it is difficult to obtain a noise reduction effect before analysis of an ambient sound is completed.

Accordingly, the present disclosure proposes a novel and improved device capable of shortening a time until an effect is obtained after start of an adaptive process mode on an ambient sound.

Solution to Problem

According to the present disclosure, there is provided a signal processing device including: a noise cancellation processing unit configured to generate a noise cancellation signal on the basis of a collected ambient sound; a signal processing unit configured to generate an ambient sound adapted signal by performing dynamic analysis related to a feature of the ambient sound and filtering the ambient sound; and a control unit configured to control a plurality of modes related to signal processing. The plurality of modes includes a first mode in which acoustic reproduction based on the noise cancellation signal is performed and a second mode in which acoustic reproduction based on the noise cancellation signal and the ambient sound adapted signal is performed, and the signal processing unit continues the dynamic analysis even in the first mode.

In addition, according to the present disclosure, there is provided a signal processing method including: by a processor, generating a noise cancellation signal on the basis of a collected ambient sound; generating an ambient sound adapted signal by performing dynamic analysis related to a feature of the ambient sound and filtering the ambient sound; and controlling a plurality of modes related to signal processing. The plurality of modes includes a first mode in which acoustic reproduction based on the noise cancellation signal is performed and a second mode in which acoustic reproduction based on the noise cancellation signal and the ambient sound adapted signal is performed, and the generation of the ambient sound adapted signal further includes continuing the dynamic analysis even in the first mode.

In addition, according to the present disclosure, there is provided a program causing a computer to function as a signal processing device including: a noise cancellation processing unit configured to generate a noise cancellation signal on the basis of a collected ambient sound; a signal processing unit configured to generate an ambient sound adapted signal by performing dynamic analysis related to a feature of the ambient sound and filtering the ambient sound; and a control unit configured to control a plurality of modes related to signal processing. The plurality of modes includes a first mode in which acoustic reproduction based on the noise cancellation signal is performed and a second mode in which acoustic reproduction based on the noise cancellation signal and the ambient sound adapted signal is performed, and the signal processing unit continues the dynamic analysis even in the first mode.

Advantageous Effects of Invention

According to the present disclosure, as described above, it is possible to shorten a time until an effect is obtained after start of an adaptive process mode on an ambient sound.

Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 4 is a diagram illustrating an operation control example of each configuration in a first mode and a second mode according to the first embodiment of the present disclosure.

FIG. 7A is a diagram illustrating examples of gain control patterns by a control unit according to the embodiment.

FIG. 7B is a diagram illustrating examples of gain control patterns by the control unit according to the embodiment.

MODE(S) FOR CARRYING OUT THE INVENTION

Figure 1:
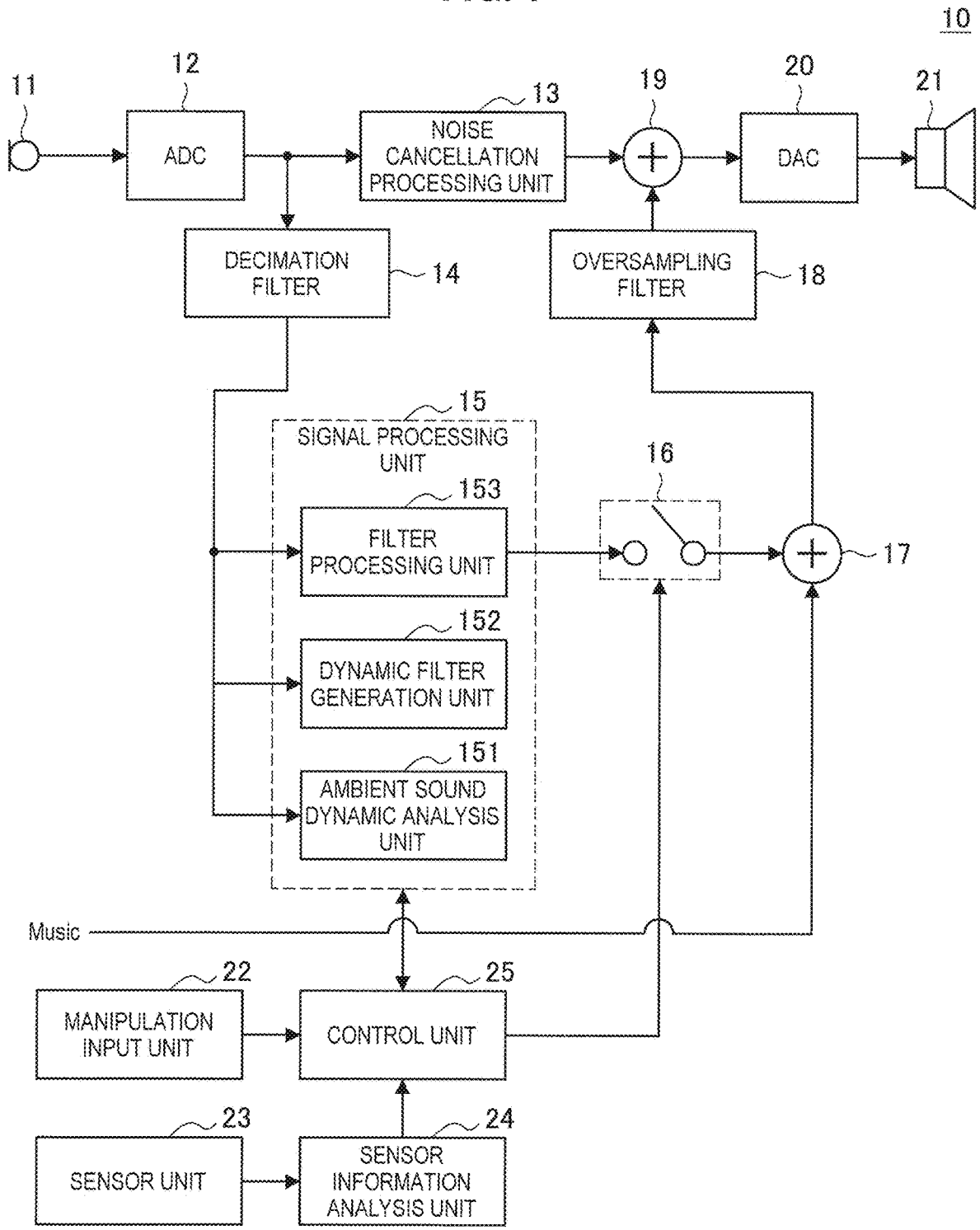
FIG. 1 is a diagram illustrating a first configuration example of a signal processing device according to a first embodiment of the present disclosure.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that the description will be made in the following order.
1. First Embodiment
1.1. Overview of first embodiment
1.2. First configuration example related to signal processing device
1.3. Second configuration example related to signal processing device
1.4. Operation control pattern in each mode
2. Second Embodiment
2.1. Overview of second embodiment
2.2. Configuration example related to signal processing device
2.3. Gain control pattern in each mode
3. Hardware configuration example
4. Conclusion

1. FIRST EMBODIMENT

1.1. Overview of First Embodiment

First, an overview of a first embodiment of the present disclosure will be described. As described above, in recent years, various acoustic devices that have a function of adapting to an external environment such as an ambient sound have been developed. For example, an acoustic device that has a noise cancellation function can cancel an ambient sound, that is, noise, by generating a noise cancellation signal based on the ambient sound collected by a microphone and acoustically combining the noise cancellation signal with the ambient sound.

In addition, for example, the acoustic device that has the noise cancellation function can reduce noise and improve clarity of a nonstationary sound by dynamically analyzing an ambient sound collected by a microphone and subtracting an estimated stationary sound from the ambient sound.

In addition, as in the technology disclosed in Patent Literature 1, it is also assumed that an ambient sound is cancelled once through the noise cancellation process and a nonstationary sound extracted through the noise reduction process is also output as a sound. Here, the foregoing nonstationary sound may include, for example, a sound such as a speech, various warnings or alarms, or the like. That is, for example, a user wearing an acoustic device can also extract only speech of other people from an ambient sound and take the speech as sound by switching a mode as necessary while cancelling an ambient sound through the noise cancellation process.

However, it normally takes time to adapt to analysis of an ambient sound in the adapting process for the ambient sound, such as the noise reduction process. Therefore, as described above, even in a case in which the user switches the mode, a time difference occurs until an effect of an adapting process can be obtained.

A signal processing device, a signal processing method, and a program according to the embodiment have been devised in view of the foregoing point and enable a time until the effect is obtained after start of an adapting process mode for an ambient sound to be considerably shortened. Therefore, the signal processing device according to the embodiment includes a signal processing unit that generates a speech signal obtained by performing an adapting process on an ambient sound (hereinafter referred to as an ambient sound adapted signal) by performing dynamic analysis related to a feature of the ambient sound to filter the ambient sound. In addition, the signal processing unit according to the embodiment has one feature in which the dynamic analysis for the ambient sound continues even in a mode in which the adapting process for the ambient sound is not performed. Hereinafter, a function of the signal processing device according to the embodiment and an effect obtained from the function will be described in detail.

1.2. First Configuration Example Related to Signal Processing Device

Next, a first configuration example of the signal processing device according to the embodiment will be described. The signal processing device according to the embodiment may be, for example, an acoustic device such as a headphone. Here, the signal processing device according to the embodiment may have a plurality of modes related to signal processing. For example, the signal processing device according to the embodiment has a first mode in which a noise cancellation process is performed and a second mode in which the noise cancellation process and an adapting process for an ambient sound are performed. At this time, the signal processing device according to the embodiment has one feature in which the dynamic analysis of the ambient sound continues even in the first mode, as described above. In the foregoing function of the signal processing device according to the embodiment, the adapting process for the ambient sound can be quickly reflected by using the analysis result performed in the first mode even in a case in which the mode is switched to the second mode.

FIG. 1 is a diagram illustrating a first configuration example of a signal processing device according to a first embodiment. Referring to FIG. 1, a signal processing device 10 according to the embodiment includes a microphone 11, an analog-to-digital converter (ADC) 12, a noise cancellation processing unit 13, a decimation filter 14, and a signal processing unit 15. Here, the signal processing unit 15 according to the embodiment includes an ambient sound dynamic analysis unit 151, a dynamic filter generation unit 152, and a filter processing unit 153. In addition, the signal processing device 10 according to the embodiment includes an ambient sound monitor output switch 16, a first addition circuit 17, an oversampling filter 18, a second addition circuit 19, a digital-to-analog (DAC) converter 20, and a speaker 21. In addition, the signal processing device 10 according to the embodiment includes a manipulation input unit 22, a sensor unit 23, a sensor information analysis unit 24, and a control unit 25.

(Microphone 11)

The microphone 11 has a function of collecting an ambient sound. The microphone 11 supplies an analog signal of the collected ambient sound to the ADC 12.

(ADC 12)

The ADC 12 has a function of converting the analog signal supplied from the microphone 11 into a digital signal. The ADC 12 supplies the converted digital signal to each of the noise cancellation processing unit 13 and the decimation filter 14.

(Noise Cancellation Processing Unit 13)

The noise cancellation processing unit 13 has a function of performing a noise cancellation process based on the digital signal supplied from the ADC 12. That is, the noise cancellation processing unit 13 according to the embodiment can generate a noise cancelled signal based on the collected ambient sound. At this time, the noise cancellation processing unit 13 according to the embodiment may perform a noise cancellation process in accordance with, for example, a feedback scheme or a feed forward scheme. Note that, for example, the configuration described in Patent Literature 1 may be used as the detailed configuration of the noise cancellation processing unit 13.

(Decimation Filter 14)

The decimation filter 14 performs a decimation process on the digital signal supplied from the ADC 12.

(Signal Processing Unit 15)

The signal processing unit 15 generates an ambient sound adapted signal on the basis of the digital signal passing through the decimation filter 14. As described above, the ambient sound adapted signal according to the embodiment may be a speech signal obtained by performing an adapting process on an ambient sound. The signal processing unit according to the embodiment can generate the ambient sound adapted signal by performing the dynamic analysis related to the feature of the ambient sound from the foregoing digital signal and filtering the ambient sound. In addition, the signal processing unit 15 according to the embodiment has one feature in which the dynamic analysis for the ambient sound continues even in the first mode in which only the noise cancellation process is performed, as described above.

Note that the adapting process for the ambient sound according to the embodiment may include, for example, various processes of following an ambient sound, such as a noise reduction process or a howling cancellation process. Therefore, configurations and functions in accordance with various processes can be adopted in the signal processing unit 15 according to the embodiment and the ambient sound dynamic analysis unit 151, the dynamic filter generation unit 152, and the filter processing unit 153 included in the signal processing unit 15.

((Ambient Sound Dynamic Analysis Unit 151))

The ambient sound dynamic analysis unit 151 has a function of performing the dynamic analysis based on the digital signal passing through the decimation filter 14. That is, the ambient sound dynamic analysis unit 151 according to the embodiment performs the dynamic analysis related to the feature of the collected ambient sound. At this time, the ambient sound dynamic analysis unit 151 according to the embodiment can analyze the feature related to a time change of the collected ambient sound in accordance with a scheme in accordance with a purpose of the adapting process.

In addition, the ambient sound dynamic analysis unit 151 according to the embodiment has one feature in which the dynamic analysis related to the feature of the ambient sound continues even in the first mode in which only the noise cancellation process is performed. In the foregoing function of the ambient sound dynamic analysis unit 151 according to the embodiment, it is possible to considerably reduce process delay when the mode is switched.

((Dynamic Filter Generation Unit 152))

The dynamic filter generation unit 152 has a function of generating the dynamic filter on the basis of a result of the dynamic analysis of the ambient sound by the ambient sound dynamic analysis unit 151. That is, the dynamic filter generation unit 152 according to the embodiment can generate the dynamic filter in accordance with the purpose of the adapting process. In addition, the dynamic filter generation unit 152 according to the embodiment may generate the foregoing filter even in the first mode in which only the noise cancellation process is performed.

((Filter Processing Unit 153))

The filter processing unit 153 has a function of filtering the digital signal passing through the decimation filter 14 using the dynamic filter generated by the dynamic filter generation unit 152. That is, the filter processing unit 153 according to the embodiment performs filtering of the ambient sound using the foregoing dynamic filter to generate the ambient sound adapted signal. As described above, the adapting process for the ambient sound according to the embodiment may include, for example, a noise reduction process and a howling cancellation process. Therefore, the ambient sound adapted signal according to the embodiment can include a speech signal subjected to the noise reduction process based on the ambient sound, a speech signal subjected to the howling cancellation, or the like.

Note that the control unit 25 to be described below may cause the filter processing unit 153 according to the embodiment not to generate the foregoing ambient sound adapted signal in the first mode in which only the noise cancellation process is performed. On the other hand, in a case in which the control unit 25 controls the ambient sound monitor output switch 16 to be described below to be turned off, the filter processing unit 153 may generate the foregoing ambient sound adapted signal even in the first mode. The details of mode control by the control unit 25 according to the embodiment will be described separately.

(Ambient Sound Monitor Output Switch 16)

The ambient sound monitor output switch 16 has a function of performing switching related to an output path of the ambient sound adapted signal generated by the signal processing unit 15 under the control of the control unit 25. Therefore, as illustrated in FIG. 1, the ambient sound monitor output switch 16 according to the embodiment is disposed between the signal processing unit 15 and the second addition circuit 19 that adds the ambient sound adapted signal and the noise cancellation signal. Specifically, the ambient sound monitor output switch 16 according to the embodiment may be set to be turned off in the first mode by the control unit 25. That is, in the first mode, the ambient sound monitor output switch 16 according to the embodiment is controlled such that the ambient sound adapted signal is not supplied to the second addition circuit 19.

(First Addition Circuit 17)

The first addition circuit 17 has a function of adding an audio signal and the ambient sound adapted signal generated by the signal processing unit 15. The first addition circuit 17 supplies the ambient sound adapted signal added to the audio signal to the oversampling filter 18.

(Oversampling Filter 18)

The oversampling filter 18 performs an oversampling process on the digital signal supplied from the first addition circuit 17.

(Second Addition Circuit 19)

The second addition circuit 19 has a function of adding the noise cancellation signal generated by the noise cancellation processing unit 13 and the digital signal passing through the oversampling filter 18. That is, the second addition circuit 19 adds the noise cancellation signal and the ambient sound adapted signal. In addition, at the time of audio reproduction, the audio signal is added. The second addition circuit 19 supplies the digital signal after the addition to the DAC 20.

(DAC 20)

The DAC 20 has a function of converting the digital signal supplied from the second addition circuit 19 into an analog signal. The DAC 20 supplies the converted analog signal to the speaker 21.

(Speaker 21)

The speaker 21 has a function of performing acoustic reproduction on the basis of the analog signal supplied from the DAC 20. That is, the speaker 21 according to the embodiment performs acoustic reproduction based on the noise cancellation signal in the first mode and performs acoustic reproduction based on the noise cancellation signal and the ambient sound adapted signal in the second mode. In addition, the speaker 21 performs an acoustic reproduction signal based on the audio signal in addition to the above at the time of audio reproduction.

(Manipulation Input Unit 22)

The manipulation input unit 22 has a function of receiving a manipulation input by the user. Specifically, the manipulation input unit 22 according to the embodiment receives an input related to a mode switching manipulation or an audio reproduction manipulation by the user. Therefore, the manipulation input unit 22 can include various buttons, switches, levers, and the like. In addition, the manipulation input unit 22 may be realized by a touch panel or the like. In addition, the manipulation input unit 22 can also receive a command transmitted from, for example, an external device such as a smartphone. The manipulation input unit 22 transmits information regarding the received manipulation input to the control unit 25.

(Sensor Unit 23)

The sensor unit 23 has a function of collecting various states related to the signal processing device 10, the user, or an external environment. Therefore, the sensor unit 23 includes, for example, various optical sensors such as a microphone, a vibration sensor, an image sensor, an acceleration sensor, a gyro sensor, a geomagnetic sensor, a pressure sensor, and an infrared sensor. In addition, the sensor unit 23 transmits the collected sensor information to the sensor information analysis unit 24.

(Sensor Information Analysis Unit 24)

The sensor information analysis unit 24 has a function of performing various kinds of analysis on the basis of the sensor information received from the sensor unit 23. The sensor information analysis unit 24 according to the embodiment may detect a speech on the basis of, for example, vibration information received from the sensor unit 23. In addition, for example, the sensor information analysis unit 24 may perform mounting determination of the signal processing device 10 on the basis of information of a pressure sensor or the like received from the sensor unit 23. In addition, for example, the sensor information analysis unit 24 may detect an operation of shaking the head of the user or the like on the basis of acceleration information or the like received from the sensor unit 23. The sensor information analysis unit 24 transmits an analysis result based on sensor information to the control unit 25.

(Control Unit 25)

The control unit 25 performs control of each function of the signal processing device 10. For example, the control unit 25 according to the embodiment has a function of controlling a plurality of modes related to signal processing. Here, as described above, the plurality of foregoing modes may include a first mode in which acoustic reproduction based on a noise cancellation signal is performed and a second mode in which acoustic reproduction based on a noise cancellation signal and an ambient sound adapted signal is performed.

Therefore, the control unit 25 according to the embodiment may perform control in accordance with each mode on the ambient sound monitor output switch 16 or each configuration of the signal processing unit 15. More specifically, in the first mode, the control unit 25 according to the embodiment may perform control to stop an operation of the filter processing unit 153.

In addition, the control unit 25 according to the embodiment can also set the ambient sound monitor output switch 16 to be turned off in the first mode and perform control such that the ambient sound adapted signal generated by the signal processing unit 15 is not supplied to the second addition circuit 19.

At this time, the control unit 25 according to the embodiment may perform switching of the first mode and the second mode on the basis of a mode switching manipulation by the user received by the manipulation input unit 22. In addition, the control unit 25 according to the embodiment can dynamically control switching of the modes on the basis of not only an explicit manipulation by the user but also various analysis results by the sensor information analysis unit 24. For example, the control unit 25 according to the embodiment may perform switching from the first mode to the second mode on the basis of detection of a speech by the sensor information analysis unit 24. In addition, for example, in a case in which the signal processing unit 15 performs a so-called beamforming process of emphasizing a listening target on directivity in an arrival direction of the listening target, the control unit 25 can also perform switching to the second mode on the basis of detection of acoustic sound from a predetermined direction.

In addition, the control function by the control unit 25 according to the embodiment is not fixed to the control of the switching of the modes or each configuration in accordance with the switching. The control unit 25 according to the embodiment may control an operation of each configuration independent from the switching of the modes. For example, the control unit 25 may perform control related to operation start, operation end, and the like of the ambient sound dynamic analysis unit 151 or the dynamic filter generation unit 152. For example, only in a case in which the sensor information analysis unit 24 detects that the signal processing device 10 is tightly mounted, the control unit 25 may perform control such that the ambient sound dynamic analysis unit 151 or the dynamic filter generation unit 152 operates. In addition, the control unit 25 may perform the foregoing operation control on the basis of, for example, a battery remaining amount or the like.

1.3. Second Configuration Example Related to Signal Processing Device

Next, a second configuration example of the signal processing device 10 according to the embodiment will be described. In the first configuration example described with reference to FIG. 1, the various adapting process for the ambient sound performed by the signal processing unit 15 according to the embodiment have been described. In the second configuration example, more specifically, a case in which the signal processing unit 15 performs a howling cancellation process and a noise reduction process will be described as an example.

Figure 2:
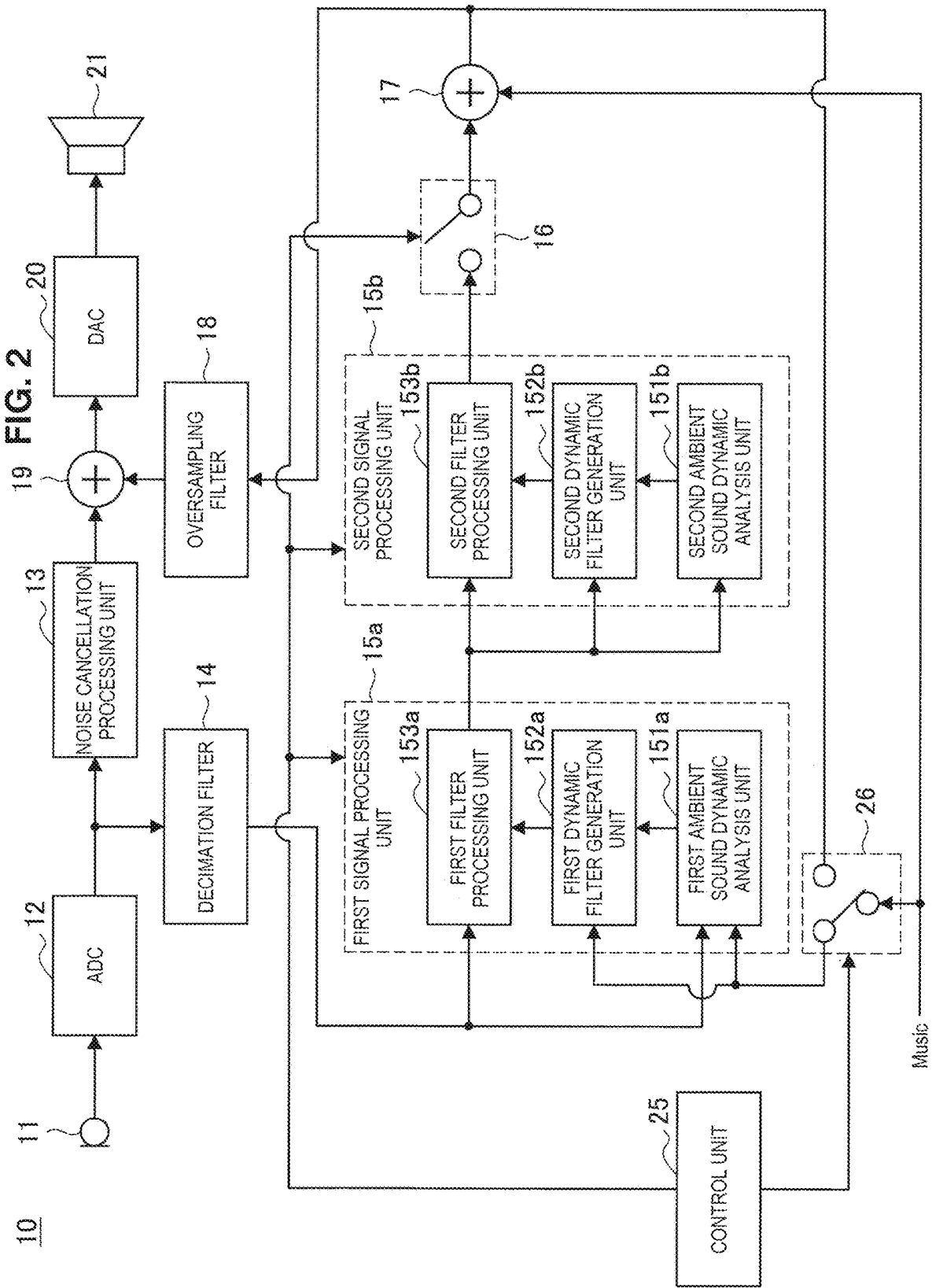
FIG. 2 is a diagram illustrating a second configuration example of the signal processing device according to the embodiment.

FIG. 2 is an explanatory diagram illustrating the second configuration example of the signal processing device 10 according to the embodiment. Referring to FIG. 2, the signal processing device 10 includes a first signal processing unit 15*a* and a second signal processing unit 15*b*. Here, the first signal processing unit 15*a* includes a first ambient sound dynamic analysis unit 151*a*, a first dynamic filter generation unit 152*a*, and a first filter processing unit 153*a*. In addition, the second signal processing unit 15*b* includes a second ambient sound dynamic analysis unit 151*b*, a second dynamic filter generation unit 152*b*, and a second filter processing unit 153*b*. In this way, the signal processing device 10 according to the embodiment may include two or more signal processing units 15.

In addition, in the second configuration example, the signal processing device 10 further include a reference signal input switch 26. In the following description, differences from the first configuration example will be mainly described and configurations and functions common to the first configuration example will not be described. Note that although not illustrated in FIG. 2, the signal processing device 10 may include the manipulation input unit 22, the sensor unit 23, and the sensor information analysis unit 24 even in the second configuration example.

(First Signal Processing Unit 15*a*)

The first signal processing unit 15*a* has a function of performing a howling cancellation process based on a collected ambient sound. That is, the first signal processing unit 15*a* according to the embodiment can remove, from the ambient sound, a frequency component occurring when an acoustic sound reproduced by the speaker 21 is collected by the microphone 11.

Figure 3:
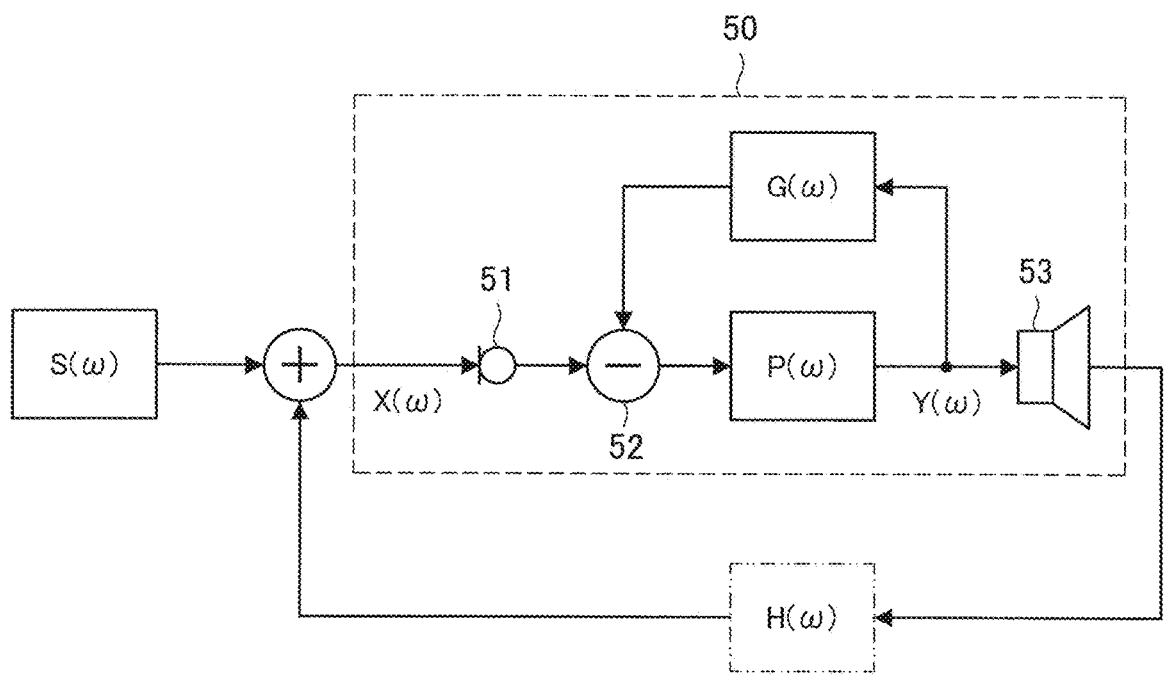
FIG. 3 is an explanatory diagram illustrating an overview of a howling cancellation process according to a technology of the present disclosure.

Here, an overview of the howling cancellation process will be described with reference to FIG. 3. FIG. 3 is an explanatory diagram illustrating the overview of the howling cancellation process. A general acoustic device 50 and a microphone 51, a subtraction circuit 52, and a speaker 53 included in the acoustic device 50 are illustrated in FIG. 3.

In addition, an output $Y(\omega)$ by the speaker 53, a feature $H(\omega)$ of a transfer path along which the output $Y(\omega)$ is fed back to the microphone 51, an ambient sound $S(\omega)$, and an input $X(\omega)$ to the microphone 51 are each illustrated in FIG. 3. That is, the input $X(\omega)$ can be expressed in $X(\omega)=S(\omega)+H(\omega)*Y(\omega)$ in FIG. 3.

At this time, the howling cancellation process is performed in order to dynamically estimate the foregoing feature $H(\omega)$ and remove a signal $H(\omega)*Y(\omega)$ fed back to the microphone 51 from the input $X(\omega)$. An estimated value $G(\omega)$ of the feature $H(\omega)$ estimated by the acoustic device 50 is illustrated in FIG. 3. At this time, an estimated value can be expressed as $G(\omega)*Y(\omega)$ of the signal fed back to the microphone 51.

That is, in a case in which the acoustic device 50 can completely perform the foregoing estimation, that is, in a case in which $G(\omega)=H(\omega)$, a subtraction result $P(\omega)$ by the subtraction circuit 52 is $P(\omega)=X(\omega)-G(\omega)*Y(\omega)=(S(\omega)+H(\omega)*Y(\omega))-G(\omega)*Y(\omega)=S(\omega)$, and thus only the ambient sound $S(\omega)$ can be extracted.

In this way, the first signal processing unit 15*a* according to the embodiment can realize the howling cancellation process by dynamically estimating a feature of a transfer path related to the acoustic feedback system illustrated in FIG. 3 and can generate an ambient sound adapted signal.

((First Ambient Sound Dynamic Analysis Unit 151*a*))

The first ambient sound dynamic analysis unit 151*a* has a function of dynamically estimating a feature of the transfer path related to the acoustic feedback system described with reference to FIG. 3. The first ambient sound dynamic analysis unit 151*a* can perform fast Fourier transform on a supplied digital signal to convert the digital signal into a frequency spectrum. In addition, the first ambient sound dynamic analysis unit 151*a* detects a frequency component with a power level equal to or greater than a predetermined value from the converted frequency spectrum and passes the frequency component to the first dynamic filter generation unit 152*a*.

In addition, at this time, the first ambient sound dynamic analysis unit 151*a* may use a digital signal or an audio signal supplied from the first addition circuit 17 as the reference signal.

In addition, as in the case of the first configuration example, the first ambient sound dynamic analysis unit 151*a* continuously performs the foregoing dynamic estimation even in the first mode.

((First Dynamic Filter Generation Unit 152*a*))

The first dynamic filter generation unit 152*a* has a function of generating a dynamic filter on the basis of the frequency component detected by the first ambient sound dynamic analysis unit 151*a*. Even in the first mode, the first dynamic filter generation unit 152*a* may continuously perform the foregoing dynamic filter generation under the control of the control unit 25.

((First Filter Processing Unit 153*a*))

The first filter processing unit 153*a* has a function of removing the frequency component originated in howling from the digital signal using the dynamic filter generated by the first dynamic filter generation unit 152*a*. That is, the first filter processing unit 153*a* according to the embodiment can generate an ambient sound adapted signal obtained by cancelling the howling from the collected ambient sound. In addition, the first filter processing unit 153*a* supplies the generated ambient sound adapted signal to the second signal processing unit 15*b*.

At this time, as in the case of the first configuration example, the first filter processing unit 153*a* is controlled by the control unit 25 such that the operation is stopped in the first mode. However, in a case in which the ambient sound monitor output switch 16 is set to be turned off by the control unit 25, the operation can continue even in the first mode.

(Second Signal Processing Unit 15*b*)

The second signal processing unit 15*b* has a function of performing a noise reduction process based on a collected ambient sound. That is, the second signal processing unit 15*b* according to the embodiment can estimate a stationary sound (noise) included in the ambient sound by dynamically analyzing the ambient sound and can generate a nonstationary sound from the ambient sound, that is, an ambient sound adapted signal from which a listening target is extracted.

((Second Ambient Sound Dynamic Analysis Unit 151*b*))

The second ambient sound dynamic analysis unit 151*b* has a function of dynamically estimating the stationary sound included in the ambient sound. The second ambient sound dynamic analysis unit 151b may perform the foregoing estimation on the basis of the ambient sound adapted signal supplied from the first filter processing unit 153a. In addition, the second ambient sound dynamic analysis unit 151b passes a power spectrum related to the estimated stationary sound to the second dynamic filter generation unit 152b.

In addition, as in the first ambient sound dynamic analysis unit 151a, the second ambient sound dynamic analysis unit 151b continuously performs the foregoing dynamic estimation even in the first mode.

((Second Dynamic Filter Generation Unit 152b))

The second dynamic filter generation unit 152b has a function of generating a dynamic filter on the basis of the power spectrum estimated by the second ambient sound dynamic analysis unit 151b. Even in the first mode, the second dynamic filter generation unit 152b may continuously perform the foregoing dynamic filter generation under the control of the control unit 25.

((Second Filter Processing Unit 153b))

The second filter processing unit 153b performs a process of subtracting the power spectrum of the estimated stationary sound from the power spectrum of the ambient sound adapted signal supplied from the first filter processing unit 153a using the dynamic filter generated by the second dynamic filter generation unit 152b. In addition, the second filter processing unit 153b performs inverse Fourier transform on the power spectrum after the subtraction to generate the ambient sound adapted signal from which the stationary sound is removed.

That is, the foregoing ambient sound adapted signal generated by the second filter processing unit 153b according to the embodiment can be said to be a speech signal subjected to the howling cancellation process and the noise reduction process. Therefore, in the second mode of the second configuration example, the acoustic reproduction based on the noise cancellation signal and the speech signal subjected to the howling cancellation process and the noise reduction process is performed.

In addition, as in the first filter processing unit 153a, the second filter processing unit 153b is controlled by the control unit 25 such that the operation is stopped in the first mode. However, in a case in which the ambient sound monitor output switch 16 is set to be turned off by the control unit 25, the operation can continue even in the first mode.

(Reference Signal Input Switch 26)

The reference signal input switch 26 has a function of switching an input path of the reference signal used in the first signal processing unit 15a under the control of the control unit 25. More specifically, as illustrated in FIG. 2, the reference signal input switch 26 performs switching so that one of the speech signal or the audio signal subjected to the addition process by the first addition circuit 17 is supplied as the reference signal to the first signal processing unit 15a.

Note that the reference signal input switch 26 may perform the foregoing switching under the control of the control unit 25. That is, the control unit 25 according to the embodiment has a function of switching the reference signal to be supplied to the first signal processing unit 15a by controlling the reference signal input switch 26.

At this time, the control unit 25 according to the embodiment may switch the reference signal to be supplied to the first signal processing unit 15a on the basis of an audio reproduction situation. More specifically, the control unit 25 according to the embodiment may supply an audio signal as the reference signal to the first signal processing unit 15a in a case in which audio reproduction is performed or a case in which an audio reproduction volume exceeds a predetermined volume. In the foregoing function of the control unit 25 according to the embodiment, the audio signal can be used as the reference signal on the basis of an audio reproduction situation and the first signal processing unit 15a can perform analysis with higher precision.

The second configuration example according to the embodiment has been described above. Note that, in the foregoing description, the case in which the signal processing device 10 includes two signal processing units 15: the first signal processing unit 15a and the second signal processing unit 15b has been described as an example, but the configuration of the signal processing device 10 according to the embodiment is not limited to the example. The signal processing device 10 according to the embodiment may include three or more signal processing units 15.

In addition, the case in which the first signal processing unit 15a performs the howling cancellation process and the second signal processing unit 15b performs the noise reduction process has been described as an example above, but the adapting process for the ambient sound according to the embodiment is not limited to the foregoing example. The signal processing device 10 according to the embodiment may include the signal processing unit 15 that performs, for example, a beamforming process.

In addition, in the foregoing description, the case in which the first signal processing unit 15a and the second signal processing unit 15b independently operate under the control of the control unit 25 has been mainly described, but operations of the plurality of signal processing units 15 according to the embodiment may be interlocked with each other. For example, in a case in which the first signal processing unit 15a performs a noise reduction process and the second signal processing unit 15b performs a beamforming process, the second signal processing unit 15b may be controlled to operate only in a case in which the first signal processing unit 15a estimates noise with a predetermined or more level. The functional configuration of the signal processing units 15 according to the embodiment can be flexibly changed in accordance with a combination or a feature of the adapting process.

1.4. Operation Control Pattern in Each Mode

The configuration examples of the signal processing device 10 according to the embodiment have been described above. Next, operation control patterns in the first mode and the second mode according to the embodiment will be described. As described above, the control unit 25 according to the embodiment controls each configuration such that the acoustic reproduction based on the noise cancellation signal is performed in the first mode and controls each configuration such that the acoustic reproduction based on the noise cancellation signal and the ambient sound adapted signal is performed in the second mode.

At this time, several patterns are assumed in the control of each configuration by the control unit 25. FIG. 4 is a diagram illustrating an operation control example of each configuration in the first mode and the second mode. In FIG. 4, operations of each configuration are classified in accordance with four levels.

Here, "A" in FIG. 4 indicates that the control unit 25 causes the configurations to operate. That is, FIG. 4 illustrates the fact that the control unit 25 causes the first ambient sound dynamic analysis unit 151a and the second ambient sound dynamic analysis unit 151b to operate in the first mode. As described above, since the first ambient sound dynamic analysis unit 151*a* and the second ambient sound dynamic analysis unit 151*b* continue the dynamic analysis even in the first mode, it is possible to considerably shorten delay at the time of mode switching. In addition, in the second mode, it can be understood that the control unit 25 causes all the configurations illustrated in FIG. 4 to operate.

In addition, "B" indicates that the control unit 25 may cause the configurations to operate or may cause the configurations not to operate in accordance with a specification. That is, FIG. 4 illustrates the fact that the control unit 25 may cause the first dynamic filter generation unit 152*a* and the second dynamic filter generation unit 152*b* to operate or may cause the first dynamic filter generation unit 152*a* and the second dynamic filter generation unit 152*b* not to operate in the first mode.

In addition, "C" indicates that the control unit 25 preferably causes the configurations not to operate from the viewpoint of a processing burden, but the operation of the configuration can be permitted. That is, FIG. 4 illustrates the fact that the control unit 25 preferably causes the first filter processing unit 153*a* and the second filter processing unit 153*b* not to operate in the first mode from the viewpoint of the processing burden, but the foregoing two configurations can also be caused to be operate in a case in which the ambient sound monitor output switch 16 is caused not to operate.

In addition, "D" indicates that the control unit 25 causes the configurations not to operate. That is, FIG. 4 illustrates that fact that the control unit 25 causes the ambient sound monitor output switch 16 not to operate in the first mode.

The details of the operation control in the first mode and the second mode according to the embodiment have been described above. In the foregoing control by the control unit 25 according to the embodiment, it is possible to continue the dynamic estimation of the ambient sound even in the first mode and it is possible to considerably shorten a time delay at the time of mode switching.

Note that the premise that the control unit 25 causes the ambient sound monitor output switch 16 not to operate in the first mode has been described above with reference to FIG. 4, but the control of each configuration according to the embodiment is not limited to the example. That is, in a case in which the first filter processing unit 153*a* and the second filter processing unit 153*b* are caused not to operate in the first mode, the control unit 25 may cause the ambient sound monitor output switch 16 to operate. The control of each configuration according to the embodiment may be flexibly changed.

2. SECOND EMBODIMENT

2.1. Overview of Second Embodiment

Next, a second embodiment of the present disclosure will be described. In the foregoing first embodiment, the signal processing device 10 that resolves time delay of an ambient sound adapting effect related to switching of the modes has been described. On the other hand, in a case in which a noise cancellation process or an adapting process for the ambient sound is performed, there is concern of an abnormal sound of a large sound pressure by so-called clip occurring. That is, when an overlarge sound pressure exceeding a maximum input value of the ADC 12 is input to the microphone 11, a peak portion of a signal waveform is saturated, and thus an unpleasant abnormal sound is assumed to be acoustically reproduced.

At this time, in the noise cancellation process, a filter disposed at the rear stage of the ADC 12 has lowpass characteristics. Therefore, even in a case in which clip occurs, the degree of a reproduced abnormal sound is allowed in many cases.

On the other hand, in the case of the adapting process for an ambient sound, a filter that does not lower a high-frequency component is used in many cases. Therefore, an abnormal sound which is a considerably abnormal strident sound at the time of clip is reproduced.

A signal processing device, a signal processing method, and a program according to the second embodiment of the present disclosure have been devised in view of the foregoing point and enable an abnormal sound by clip to be prevented from occurring even in a case in which a noise cancellation process and an adapting process for an ambient sound are simultaneously performed. Therefore, the signal processing device 10 according to the embodiment has a function of adjusting a first gain related to an analog signal of a collected ambient sound and a second gain related to a digital signal of the ambient sound to be supplied to the signal processing unit 15 in accordance with the mode. At this time, a signal processing device 10 according to the embodiment performs control such that the first gain in the first mode is greater than the first gain in the second mode. In addition, at this time, the signal processing device 10 according to the embodiment performs control such that a total sum of the first gain and the second gain is 0 dB. Hereinafter, a function of the signal processing device according to the embodiment and an effect obtained from the function will be described in detail.

2.2. Configuration Example Related to Signal Processing Device

Figure 5:
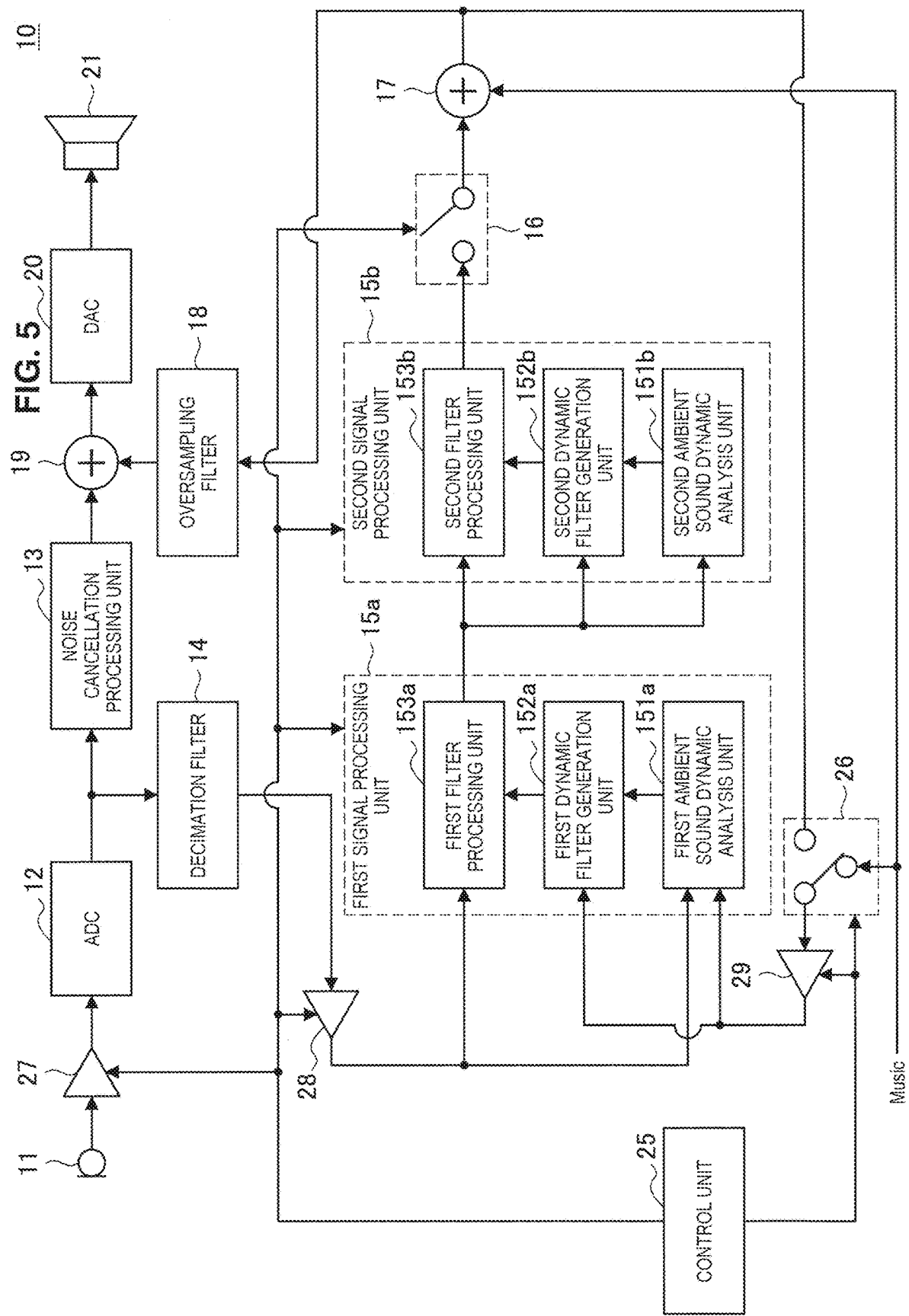
FIG. 5 is a diagram illustrating a configuration example of a signal processing device according to a second embodiment of the present disclosure.

Next, a configuration example of the signal processing device 10 according to the embodiment will be described. FIG. 5 is a diagram illustrating the configuration example of the signal processing device 10 according to the embodiment. Referring to FIG. 5, the signal processing device 10 according to the embodiment further includes a first amplifier 27, a second amplifier 28, and a third amplifier 29 in addition to the configuration illustrated in FIG. 2.

In the following description, differences from the first embodiment will be mainly described and common configurations and functions to the first embodiment will not be described. Note that, although not illustrated in FIG. 5, the signal processing device 10 may also include the manipulation input unit 22, the sensor unit 23, and the sensor information analysis unit 24 in the second embodiment.

(First Amplifier 27)

The first amplifier 27 has a function of adjusting the first gain related to an analog signal of a collected ambient sound. Therefore, the first amplifier 27 according to the embedment may be disposed between the microphone 11 and the ADC 12.

In addition, the first amplifier 27 according to the embodiment adjusts the first gain under the control of the control unit 25. At this time, the control unit 25 according to the embodiment controls the first amplifier such that the first gain in the first mode is greater than the first gain in the second mode. For example, in the first mode, the control unit 25 may perform control such that the first gain is raised using the second mode as a reference. In addition, for example, in the second mode, the control unit 25 may perform control such that the first gain is lowered using the first mode as a reference.

In the foregoing control by the control unit 25 according to the embodiment, it is possible to set the gain to be large and maintain precision of a process in the first mode in which only the noise cancellation process is performed.
(Second Amplifier 28)

The second amplifier 28 has a function of adjusting the twenty-second gain related to the digital signal of the ambient sound to be supplied to the first signal processing unit 15a. At this time, the second amplifier 28 is disposed at a position at which there is no influence on the digital signal to be supplied to the noise cancellation processing unit 13. Therefore, the second amplifier 28 according to the embodiment may be disposed between the decimation filter 14 and the first signal processing unit 15a, as illustrated in FIG. 5.

In addition, the second amplifier 28 according to the embodiment adjusts the second gain under the control of the control unit 25 as in the first amplifier 27. At this time, the control unit 25 according to the embodiment controls the second amplifier such that an absolute value of a total sum of a variation value related to the first gain and a variation value related to the second gain is less than an absolute value of the variation value related to the first gain. In a case in which the foregoing control of the control unit 25 according to the embodiment is not performed, a gain of the digital signal supplied in accordance with the mode is changed. Therefore, performance of the adapting process for the ambient sound deteriorates. Therefore, the control unit 25 according to the embodiment can prevent the deterioration in the performance of the adapting process by setting the second gain on the basis of the variation value of the first gain, and thus it is possible to maintain high precision of the dynamic analysis.

At this time, more specifically, in a case in which the variation value related to the first gain is greater than 0 dB, the control unit 25 according to the embodiment may control the second amplifier such that the variation value related to the second gain is greater than twice an opposite number of the variation value related to the first gain and is less than 0 dB. That is, in a case in which $\Delta X$ is the variation value related to the first gain and $\Delta Y$ is the variation value related to the second gain, the control unit 25 according to the embodiment controls the second amplifier such that $\Delta Y$ satisfies a range of $-\Delta X*2<\Delta Y<0$.

In addition, in a case in which the variation value related to the first gain is less than 0 dB, the control unit 25 according to the embodiment may control the second amplifier such that the variation value related to the second gain is less than twice an opposite number of the variation value related to the first gain and is greater than 0 dB. That is, in a case in which $\Delta X$ is the variation value related to the first gain and $\Delta Y$ is the variation value related to the second gain, the control unit 25 according to the embodiment controls the second amplifier such that $\Delta Y$ satisfies a range of $0<\Delta Y<|\Delta X|*2$.

When the control unit 25 according to the embodiment sets the second gain so that the foregoing range is satisfied, a value varied in the control of the first gain can approach 0 dB. Therefore, in the foregoing function of the control unit 25, it is possible to reduce the degree of deterioration in the performance of the adapting process.

Note that the control unit 25 according to the embodiment can also control the second amplifier such that the total sum of the variation value related to the first gain and the variation value related to the second gain is substantially 0 dB. In this case, since the value varied in the control of the first gain can be mostly reset, it is possible to suppress the deterioration in the performance of the adapting process to the minimum.

As described above, in the foregoing control of the control unit 25 according to the embodiment, it is possible to maintain the same gain of the digital signal to be supplied to the first signal processing unit 15a in the first mode and the second mode. That is, it is possible to maintain high precision of the dynamic analysis by the first signal processing unit 15a and the second signal processing unit 15b.
(Third Amplifier 29)

The third amplifier 29 has a function of adjusting a third gain related to a reference signal of the first signal processing unit 15a. Therefore, the third amplifier 29 according to the embodiment may be disposed between the reference signal input switch 26 and the first signal processing unit 15a.

The third amplifier 29 according to the embodiment adjusts the third gain under the control of the control unit 25 as in the first amplifier 27 and the second amplifier 28. At this time, the control unit 25 according to the embodiment controls the third amplifier such that an absolute value of a difference between the variation value related to the first gain and a variation value related to the third gain is less than an absolute value of the variation value related to the first gain. In the foregoing function of the control unit 25 according to the embodiment, it is possible to adjust the third gain related to the reference signal to be interlocked with the first gain, and thus an effect of preventing deterioration in performance of the howling cancellation process is expected.

At this time, more specifically, in a case in which the variation value related to the first gain is greater than 0 dB, the control unit 25 according to the embodiment may control the third amplifier such that the variation value related to the third gain is less than twice the variation of the first gain and is greater than 0 dB. That is, in a case in which $\Delta X$ is the variation value related to the first gain and $\Delta Z$ is the variation value related to the third gain, the control unit 25 according to the embodiment controls the third amplifier such that $\Delta Z$ satisfies a range of $0<\Delta Z<2*\Delta X$.

In addition, in a case in which the variation value related to the first gain is less than 0 dB, the control unit 25 according to the embodiment may control the third amplifier such that the variation value related to the third gain is greater than the double of the variation of the first gain and is less than 0 dB. That is, in a case in which $\Delta X$ is the variation value related to the first gain and $\Delta Z$ is the variation value related to the third gain, the control unit 25 according to the embodiment controls the third amplifier such that $\Delta Z$ satisfies a range of $-2*|\Delta X|<\Delta Z<0$.

Note that the control unit 25 according to the embodiment can also control the third amplifier such that the variation value related to the first gain is substantially the same as the variation value related to the third gain.

Figure 6:
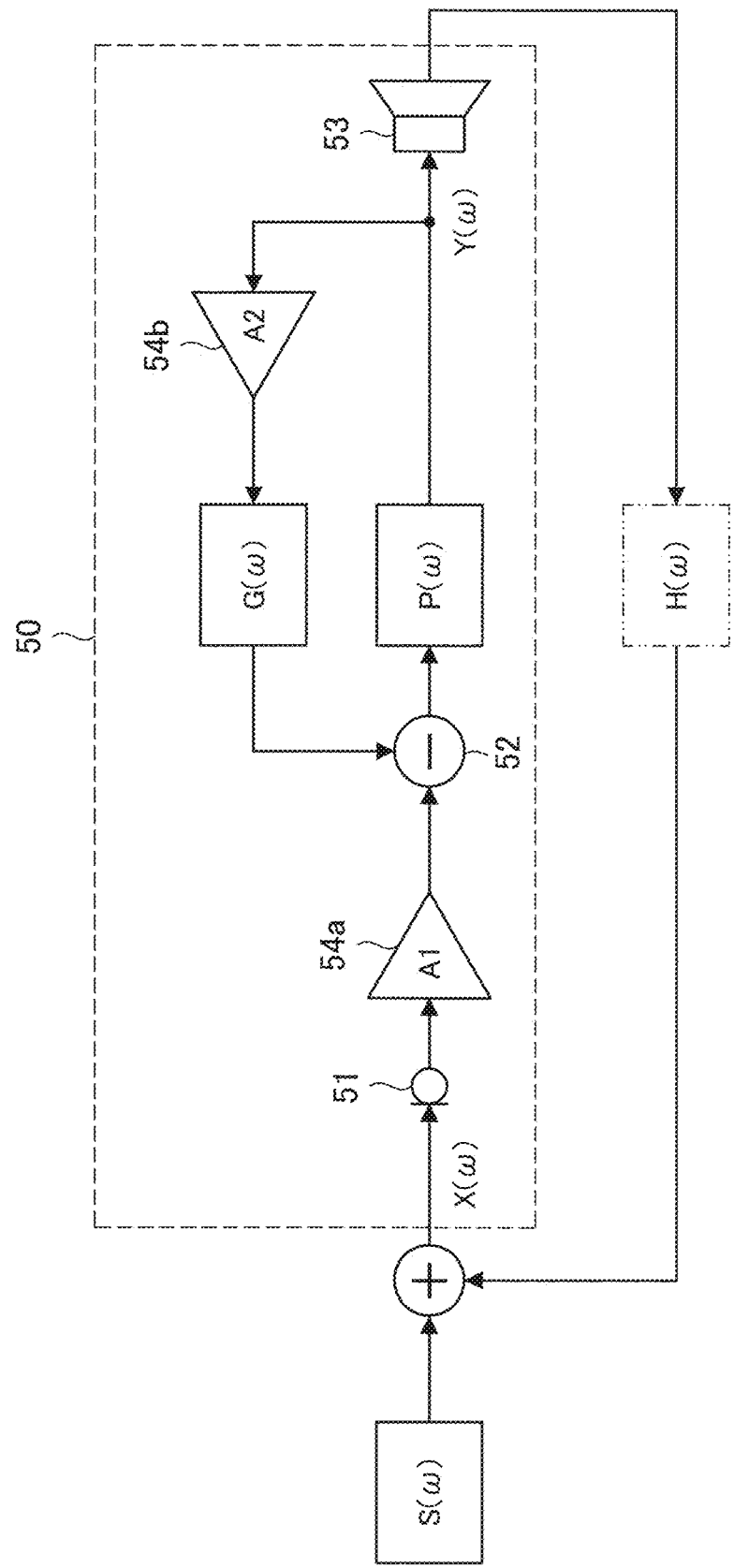
FIG. 6 is an explanatory diagram illustrating an effect obtained in third gain control according to the embodiment.

Here, effects obtained in the third gain control will be described with reference to FIG. 6. FIG. 6 is an explanatory diagram illustrating the effects obtained in the third gain control according to the embodiment. As in FIG. 3, the general acoustic device 50 and the microphone 51, the subtraction circuit 52, and the speaker 53 included in the acoustic device 50 are illustrated in FIG. 6. In addition, in FIG. 6, two amplifiers 54a and 54b included in the acoustic device 50 and gains A1 and A2 of these amplifiers are illustrated in addition to the foregoing configuration.

Note that since an output $Y(\omega)$, a feature $H(\omega)$ of a transfer path, an ambient sound $S(\omega)$, an input $X(\omega)$, an estimated value G(ω), and a subtraction result P(ω) illustrated in FIG. 6 are defined similarly to the case of FIG. 3, the description thereof will be omitted.

Here, in the case of the example illustrated in FIG. 6, a subtraction result P(w) can be expressed as $P(w)=(A1*X(ω))-(A2*G(ω))*Y(ω))=A1*S(ω)+(A2*H(ω)-A1*G(ω))Y(ω)$. At this time, when $G(ω)=H(ω)*(A2/A1)$ is satisfied, a solution to the foregoing expression is S(ω), and thus noise can be completely cancelled.

At this time, in a case in which A2/A1 is constant, for example, a case in which interlocking control of the gains is performed so that A2=A1 is satisfied, the acoustic device 50 can accomplish a process by estimating the estimated value G(ω) to follow a change in the feature H(ω) of the transfer path as in the case of FIG. 3.

Conversely, in a case in which A2/A1 varies depending on a situation, the acoustic device 50 is required to cause the estimated value G(ω) to follow not only the feature H(ω) of the transfer path but also the gains A1 and A2, and thus the howling cancellation process becomes complicated and it is difficult to generate the dynamic filter.

Therefore, when the control unit 25 according to the embodiment performs control such that the second gain corresponding to the foregoing gain A1 and the third gain corresponding to the foregoing gain A2 are constant, it is possible to prevent the complication of the howling cancellation process.

2.3. Gain Control Pattern in Each Mode

The configuration examples of the signal processing device 10 according to the embodiment have been described above. Next, gain control patterns in the first mode and the second mode according to the embodiment will be described. As described above, the control unit 25 according to the embodiment has a function of controlling the first to third gains in accordance with switching of the modes. At this time, in the gain control of the control unit 25, two patterns are assumed.

FIG. 7A is a diagram illustrating examples of gain control patterns by the control unit 25 according to the embodiment. FIG. 7A illustrates an example of gain control performed by the control unit 25 in the first mode when gain setting in the second mode is used as a reference.

As illustrated in FIG. 7A, the control unit 25 according to the embodiment controls the first amplifier such that the first gain in the first mode is greater than the first gain in the second mode. In the case of the example illustrated in FIG. 7A, the control unit 25 controls the first amplifier 27 such that the first gain in the first mode is +X dB.

In addition, the control unit 25 according to the embodiment controls the second amplifier 28 such that the total sum of the variation value related to the first gain and the variation value related to the second gain is 0 dB. In the case of the example illustrated in FIG. 7A, in order for the total sum of the foregoing variation values to be 0 dB, the control unit 25 controls the second amplifier 28 such that the second gain is −X dB.

In addition, the control unit 25 according to the embodiment controls the third amplifier 29 such that the total sum of the variation value related to the second gain and the variation value related to the third gain is 0 dB. In the case of the example illustrated in FIG. 7A, in order for the total sum of the foregoing variation values to be 0 dB, the control unit 25 controls the third amplifier 29 such that the third gain is +X dB.

The gain control in the first mode when the gain setting in the second mode is used as the reference has been described above. As described above, the control unit 25 according to the embodiment may perform control such that the first gain and the third gain are raised and the second gain is lowered in the first mode.

On the other hand, FIG. 7B is a diagram illustrating other gain control patterns by the control unit 25 according to the embodiment. FIG. 7B illustrates an example of gain control performed by the control unit 25 in the second mode when gain setting in the first mode is used as a reference.

As described above, the control unit 25 according to the embodiment controls the first amplifier such that the first gain in the first mode is greater than the first gain in the second mode. In the case of the example illustrated in FIG. 7B, the control unit 25 controls the first amplifier 27 such that the first gain in the second mode is −X dB.

In addition, the control unit 25 according to the embodiment controls the second amplifier 28 such that the total sum of the variation value related to the first gain and the variation value related to the second gain is 0 dB. In the case of the example illustrated in FIG. 7B, in order for the total sum of the foregoing variation values to be 0 dB, the control unit 25 controls the second amplifier 28 such that the second gain is +X dB.

In addition, the control unit 25 according to the embodiment controls the third amplifier 29 such that the total sum of the variation value related to the second gain and the variation value related to the third gain is 0 dB. In the case of the example illustrated in FIG. 7B, in order for the total sum of the foregoing variation values to be 0 dB, the control unit 25 controls the third amplifier 29 such that the third gain is −X dB.

The gain control in the second mode when the gain setting in the first mode is used as the reference has been described above. As described above, the control unit 25 according to the embodiment may perform control such that the first gain and the third gain are lowered and the second gain is raised in the second mode.

As described above, in the gain control function of the control unit 25 according to the embodiment, it is possible to simultaneously realize the noise cancellation process of reducing noise of the ADC 12 and the adapting process of reducing a possibility of an abnormal sound by clip occurring.

3. HARDWARE CONFIGURATION EXAMPLE

Figure 8:
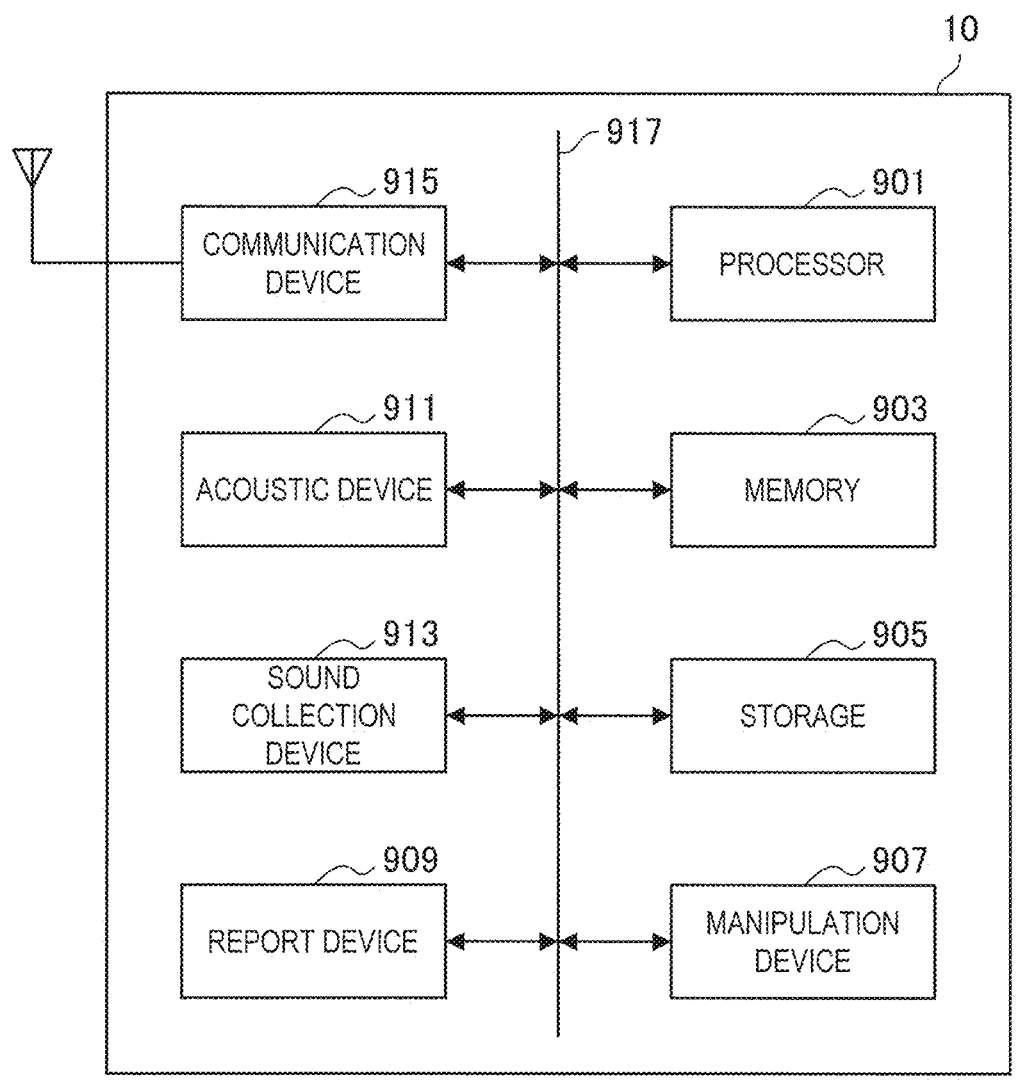
FIG. 8 is a diagram illustrating a hardware configuration example of the signal processing device according to the present disclosure.

Next, a hardware configuration example of the signal processing device 10 according to each embodiment of the present disclosure will be described with reference to FIG. 8. As illustrated in FIG. 8, the signal processing device 10 according to the embodiment includes a processor 901, a memory 903, a storage 905, a manipulation device 907, a report device 909, an acoustic device 911, a sound collection device 913, and a bus 917. In addition, the signal processing device 10 may further include a communication device 915.

The processor 901 may be a central processing unit (CPU), a graphics processing unit (GPU), a digital signal processor (DSP), or a system on chip (SoC) and performs various processes in the signal processing device 10. The processor 901 can include, for example, an electronic circuit that performs various arithmetic processes.

The memory 903 includes a random access memory (RAM) and a read-only memory (ROM) and stores data and a program executed by the processor 901. The storage 905 can include a storage medium such as a semiconductor memory, a hard disk, or the like.

The manipulation device 907 has a function of generating an input signal used for the user to perform a desired manipulation. The manipulation device 907 may include, for example, a touch panel. In addition, as another example, the manipulation device 907 may include an input unit such as a button, a switch, a keyboard, and the like used for the user to input information and an input control circuit that generates an input signal, for example, in response to an input by the user and supplies the input signal to the processor 901.

The report device 909 is an example of an output device and may be, for example, a liquid crystal display (LCD) device, an organic EL (organic light emitting diode (OLED)) display, or the like. In this case, the report device 909 can report predetermined information to the user by performing screen display.

Note that the example of the foregoing report device 909 is merely exemplary and an aspect of the report device 909 is not particularly limited as long as predetermined information can be reported to the user. As a specific example, the report device 909 may be a device that reports predetermined information to the user by blinking a pattern, such as a light emitting diode (LED). In addition, the report device 909 may be a device that reports predetermined information to the user by vibration, such as a so-called vibrator.

The acoustic device 911 is a device that reports predetermined information to the user by outputting a predetermined acoustic signal, such as a speaker.

The sound collection device 913 is a device such as a microphone that collects a voice spoken by the user or a surrounding ambient sound and acquires acoustic information (an acoustic signal). In addition, the sound collection device 913 may acquire data indicating an analog acoustic signal representing a collected sound or acoustic sound as acoustic information or may converts the analog acoustic signal into a digital acoustic signal and acquire data indicating the converted digital acoustic signal as acoustic information.

The communication device 915 is communication means included in the signal processing device 10 and communicates with an external device via a network. The communication device 915 is a wired or wireless communication interface. In a case in which the communication device 915 is configured as a wireless communication interface, the communication device 915 may include a communication antenna, a radio frequency (RF) circuit, a baseband processor, and the like.

The communication device 915 has a function of performing various kinds of signal processing on a signal received from an external device and supplies a digital signal generated from the received analog signal to the processor 901.

The bus 917 connects the processor 901, the memory 903, the storage 905, the manipulation device 907, the report device 909, the acoustic device 911, the sound collection device 913, and the communication device 915 to each other. The bus 917 may include a plurality of types of buses.

4. CONCLUSION

As described above, the signal processing device 10 according to the present disclosure has the first node in which the noise cancellation process is performed and the second mode in which the noise cancellation process and the adapting process for an ambient sound are performed. At this time, the signal processing device 10 according to the embodiment has one feature in which the dynamic analysis related to the foregoing adapting process continues even in the first mode. In the configuration, it is possible to shorten a time until the effect is obtained from start of the adapting process mode for the ambient sound.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A signal processing device including:

a noise cancellation processing unit configured to generate a noise cancellation signal on the basis of a collected ambient sound;

a signal processing unit configured to generate an ambient sound adapted signal by performing dynamic analysis related to a feature of the ambient sound and filtering the ambient sound; and a control unit configured to control a plurality of modes related to signal processing, in which the plurality of modes includes a first mode in which acoustic reproduction based on the noise cancellation signal is performed and a second mode in which acoustic reproduction based on the noise cancellation signal and the ambient sound adapted signal is performed, and the signal processing unit continues the dynamic analysis even in the first mode.

(2)

The signal processing device according to (1), in which the signal processing unit includes a dynamic analysis unit that performs the dynamic analysis related to the feature of the ambient sound, a dynamic filter generation unit that generates a dynamic filter on the basis of a result of the dynamic analysis by the dynamic analysis unit, and a filter processing unit that generates the ambient sound adapted signal by performing filtering of the ambient sound using the dynamic filter generated by the dynamic filter generation unit, and the dynamic analysis unit performs the dynamic analysis even in the first mode.

(3)

The signal processing device according to (2), in which the dynamic filter generation unit generates the dynamic filter even in the first mode.

(4)

The signal processing device according to (2) or (3), in which the control unit causes an operation of the filter processing unit to stop in the first mode.

(5)

The signal processing device according to any of (1) to (3), further including:

an ambient sound monitor output switch related to an output of the ambient sound adapted signal, in which the ambient sound monitor output switch is disposed between the signal processing unit and an addition circuit that adds the ambient sound adapted signal and the noise cancellation signal, and the control unit sets the ambient sound monitor output switch to be turned off in the first mode.

(6)

The signal processing device according to (5), in which the signal processing unit generates the ambient sound adapted signal even in the first mode.

(7)

The signal processing device according to any of (1) to (6), in which the ambient sound adapted signal includes at least any of a speech signal subjected to a noise reduction process based on the ambient sound or a speech signal subjected to a howling cancellation process.

(8)

The signal processing device according to any of (1) to (7), including:

the two or more signal processing units.

(9)

The signal processing device according to any of (1) to (8), including:

a first signal processing unit configured to perform a howling cancellation process based on the ambient sound; and a second signal processing unit configured to perform a noise reduction process based on the ambient sound, in which the ambient sound adapted signal generated by the second signal processing unit is a speech signal subjected to the howling cancellation process and the noise reduction process, and in the second mode, acoustic reproduction based on the noise cancellation signal and the ambient sound adapted signal generated by the second signal processing unit is performed.

(10)

The signal processing device according to (7), in which the control unit switches a reference signal to be supplied to the signal processing unit on the basis of an audio reproduction situation.

(11)

The signal processing device according to (7), in which the control unit supplies an audio signal as a reference signal to the signal processing unit in a case in which audio reproduction is performed.

(12)

The signal processing device according to any of (1) to (11), further including:

a first amplifier configured to adjust a first gain related to an analog signal of the collected ambient sound; and a second amplifier configured to adjust a second gain related to a digital signal of the ambient sound supplied to the signal processing unit, in which the second amplifier is disposed at a position at which there is no influence on a digital signal supplied to the noise cancellation processing unit, and the control unit controls the first amplifier such that the first gain in the first mode is greater than the first gain in the second mode and controls the second amplifier such that an absolute value of a total sum of a variation value related to the first gain and a variation value related to the second gain is less than the absolute value of the variation value related to the first gain.

(13)

The signal processing device according to (12), in which, in a case in which the variation value related to the first gain is greater than 0 dB, the control unit controls the second amplifier such that the variation value related to the second gain is greater than twice an opposite number of the variation value related to the first gain and is less than 0 dB.

(14)

The signal processing device according to (12) or (13), in which, in a case in which the variation value related to the first gain is less than 0 dB, the control unit controls the second amplifier such that the variation value related to the second gain is less than twice an opposite value of the variation value related to the first gain and is greater than 0 dB.

(15)

The signal processing device according to any of (12) to (14), in which the control unit controls the second amplifier such that a total sum of the variation value related to the first gain and the variation value related to the second gain is substantially 0 dB.

(16)

The signal processing device according to (12), in which the signal processing unit includes at least a first signal processing unit that performs a howling cancellation process based on the ambient sound, the signal processing device further includes a third amplifier that adjusts a third gain related to a reference signal of the first signal processing unit, and the control unit controls the third amplifier such that an absolute value of a difference between the variation value related to the first gain and a variation value related to the third gain is less than an absolute value of the variation value related to the first gain.

(17)

The signal processing device according to (16), in which the control unit performs control such that the first gain and the third gain are raised and the second gain is lowered in the first mode.

(18)

The signal processing device according to (16) or (17), in which the control unit performs control such that the first gain and the third gain are lowered and the second gain is raised in the second mode.

(19)

A signal processing method including: by a processor, generating a noise cancellation signal on the basis of a collected ambient sound;

generating an ambient sound adapted signal by performing dynamic analysis related to a feature of the ambient sound and filtering the ambient sound; and controlling a plurality of modes related to signal processing, in which the plurality of modes includes a first mode in which acoustic reproduction based on the noise cancellation signal is performed and a second mode in which acoustic reproduction based on the noise cancellation signal and the ambient sound adapted signal is performed, and the generation of the ambient sound adapted signal further includes continuing the dynamic analysis even in the first mode.

(20)

A program causing a computer to function as a signal processing device including:

a noise cancellation processing unit configured to generate a noise cancellation signal on the basis of a collected ambient sound;

a signal processing unit configured to generate an ambient sound adapted signal by performing dynamic analysis related to a feature of the ambient sound and filtering the ambient sound; and a control unit configured to control a plurality of modes related to signal processing, in which the plurality of modes includes a first mode in which acoustic reproduction based on the noise cancellation signal is performed and a second mode in which acoustic reproduction based on the noise cancellation signal and the ambient sound adapted signal is performed, and the signal processing unit continues the dynamic analysis even in the first mode.

REFERENCE SIGNS LIST 10 signal processing device
13 noise cancellation processing unit
15 signal processing unit
151 ambient sound dynamic analysis unit
152 dynamic filter generation unit
153 filter processing unit
15a first signal processing unit
151a first ambient sound dynamic analysis unit
152a first dynamic filter generation unit
153a first filter processing unit
15b second signal processing unit
151b second ambient sound dynamic analysis unit
152b second dynamic filter generation unit
153b second filter processing unit
16 ambient sound monitor output switch
17 first addition circuit
19 second addition circuit
25 control unit
26 reference signal input switch
27 first amplifier
28 second amplifier
29 third amplifier

The invention claimed is:

1. A signal processing device comprising:
a noise cancellation processing unit configured to generate a noise cancellation signal on a basis of a collected ambient sound;
a signal processing unit configured to generate an ambient sound adapted signal by performing dynamic analysis related to a feature of the ambient sound and filtering the ambient sound;
a first amplifier configured to adjust a first gain related to an analog signal of the collected ambient sound;
a second amplifier configured to adjust a second gain related to a digital signal of the ambient sound supplied to the signal processing unit; and
a control unit configured to control a plurality of modes related to signal processing,
wherein the plurality of modes includes a first mode in which acoustic reproduction based on the noise cancellation signal is performed and a second mode in which acoustic reproduction based on the noise cancellation signal and the ambient sound adapted signal is performed,
the signal processing unit continues the dynamic analysis even in the first mode,
the dynamic analysis is performed in the first mode and the second mode but forms a basis of the acoustic reproduction only after switching from the first mode to the second mode, the control unit is configured to control the first amplifier such that the first gain in the first mode is greater than the first gain in the second mode, and
the second amplifier is disposed at a position at which there is no influence on a digital signal supplied to the noise cancellation processing unit.

2. The signal processing device according to claim 1, wherein the signal processing unit includes
a dynamic analysis unit that performs the dynamic analysis related to the feature of the ambient sound,
a dynamic filter generation unit that generates a dynamic filter on a basis of a result of the dynamic analysis by the dynamic analysis unit, and
a filter processing unit that generates the ambient sound adapted signal by performing filtering of the ambient sound using the dynamic filter generated by the dynamic filter generation unit, and
the dynamic analysis unit performs the dynamic analysis even in the first mode.

3. The signal processing device according to claim 2, wherein the dynamic filter generation unit generates the dynamic filter even in the first mode.

4. The signal processing device according to claim 2, wherein the control unit causes an operation of the filter processing unit to stop in the first mode.

5. The signal processing device according to claim 1, further comprising:
an ambient sound monitor output switch related to an output of the ambient sound adapted signal,
wherein the ambient sound monitor output switch is disposed between the signal processing unit and an addition circuit that adds the ambient sound adapted signal and the noise cancellation signal, and
the control unit sets the ambient sound monitor output switch to be turned off in the first mode.

6. The signal processing device according to claim 5, wherein the signal processing unit generates the ambient sound adapted signal even in the first mode.

7. The signal processing device according to claim 1, wherein the ambient sound adapted signal includes at least any of a speech signal subjected to a noise reduction process based on the ambient sound or a speech signal subjected to a howling cancellation process.

8. The signal processing device according to claim 1, comprising:
the two or more signal processing units.

9. The signal processing device according to claim 1, comprising:
a first signal processing unit configured to perform a howling cancellation process based on the ambient sound; and
a second signal processing unit configured to perform a noise reduction process based on the ambient sound,
wherein the ambient sound adapted signal generated by the second signal processing unit is a speech signal subjected to the howling cancellation process and the noise reduction process, and
in the second mode, acoustic reproduction based on the noise cancellation signal and the ambient sound adapted signal generated by the second signal processing unit is performed.

10. The signal processing device according to claim 7, wherein the control unit switches a reference signal to be supplied to the signal processing unit on a basis of an audio reproduction situation.

11. The signal processing device according to claim 7, wherein the control unit supplies an audio signal as a reference signal to the signal processing unit in a case in which audio reproduction is performed.

12. The signal processing device according to claim 1, wherein, in a case in which a variation value related to the first gain is greater than 0 dB, the control unit controls the second amplifier such that a variation value related to the second gain is greater than twice an opposite number of the variation value related to the first gain and is less than 0 dB.

13. The signal processing device according to claim 1, wherein, in a case in which a variation value related to the first gain is less than 0 dB, the control unit controls the second amplifier such that a variation value related to the second gain is less than twice an opposite value of the variation value related to the first gain and is greater than 0 dB.

14. The signal processing device according to claim 1 wherein the control unit controls the second amplifier such that a total sum of a variation value related to the first gain and a variation value related to the second gain is substantially 0 dB.

15. The signal processing device according to claim 1, wherein the signal processing unit includes at least a first signal processing unit that performs a howling cancellation process based on the ambient sound, the signal processing device further includes a third amplifier that adjusts a third gain related to a reference signal of the first signal processing unit, and the control unit controls the third amplifier such that an absolute value of a difference between a variation value related to the first gain and a variation value related to the third gain is less than an absolute value of the variation value related to the first gain.

16. The signal processing device according to claim 15, wherein the control unit performs control such that the first gain and the third gain are raised and the second gain is lowered in the first mode.

17. The signal processing device according to claim 15, wherein the control unit performs control such that the first gain and the third gain are lowered and the second gain is raised in the second mode.

18. A signal processing method comprising:
generating, by a processor, a noise cancellation signal on a basis of a collected ambient sound;
generating, by the processor, an ambient sound adapted signal by performing dynamic analysis related to a feature of the ambient sound and filtering the ambient sound;
adjusting, by a first amplifier, a first gain related to an analog signal of the collected ambient sound;
adjusting, by a second amplifier, a second gain related to a digital signal of the ambient sound supplied for generating the ambient sound adapted signal; and
controlling, by the processor, a plurality of modes related to signal processing,
wherein the plurality of modes includes a first mode in which acoustic reproduction based on the noise cancellation signal is performed and a second mode in which acoustic reproduction based on the noise cancellation signal and the ambient sound adapted signal is performed,
the generation of the ambient sound adapted signal further includes continuing the dynamic analysis even in the first mode,
the dynamic analysis is performed in the first mode and the second mode but forms a basis of the acoustic reproduction only after switching from the first mode to the second mode,
the first amplifier is controlled such that the first gain in the first mode is greater than the first gain in the second mode, and
the second amplifier is disposed at a position at which there is no influence on a digital signal supplied for generating the noise cancellation signal.

19. At least one non-transitory computer-readable storage medium storing processor-executable instructions that, when executed by at least one processor, cause the at least one processor to function as a signal processing device including:
a noise cancellation processing unit configured to generate a noise cancellation signal on a basis of a collected ambient sound;
a signal processing unit configured to generate an ambient sound adapted signal by performing dynamic analysis related to a feature of the ambient sound and filtering the ambient sound;
a first amplifier configured to adjust a first gain related to an analog signal of the collected ambient sound;
a second amplifier configured to adjust a second gain related to a digital signal of the ambient sound supplied to the signal processing unit; and
a control unit configured to control a plurality of modes related to signal processing,
wherein the plurality of modes includes a first mode in which acoustic reproduction based on the noise cancellation signal is performed and a second mode in which acoustic reproduction based on the noise cancellation signal and the ambient sound adapted signal is performed,
the signal processing unit continues the dynamic analysis even in the first mode,
the dynamic analysis is performed in the first mode and the second mode but forms a basis of the acoustic reproduction only after switching from the first mode to the second mode,
the control unit is configured to control the first amplifier such that the first gain in the first mode is greater than the first gain in the second mode, and
the second amplifier is disposed at a position at which there is no influence on a digital signal supplied to the noise cancellation processing unit.

* * * * *